United States Patent [19]

Motojima et al.

[11] Patent Number: 4,612,562
[45] Date of Patent: Sep. 16, 1986

[54] PNPN SWITCH DEVICE WITH CAPACITOR FORMED OUTSIDE ACTIVE DEVICE AREAS

[75] Inventors: Hideaki Motojima; Hiroki Takayama, both of Yokohama; Jun-ichi Ohura, Tokyo, all of Japan

[73] Assignee: Kabushiki Kaisha Toshiba, Tokyo, Japan

[21] Appl. No.: 741,148

[22] Filed: Jun. 4, 1985

[30] Foreign Application Priority Data

Jun. 5, 1984 [JP] Japan .................. 59-114909
Dec. 26, 1984 [JP] Japan .................. 59-273261

[51] Int. Cl.[4] ........................... H01L 29/74
[52] U.S. Cl. ................... 357/38; 357/23.4; 357/30; 357/39; 357/51; 357/54; 357/59; 357/86
[58] Field of Search ............ 357/23.4, 30, 38, 39, 357/51, 59, 86, 54

[56] References Cited

U.S. PATENT DOCUMENTS 4,244,000  1/1981  Ueda et al. ................. 357/38
4,489,340  12/1984  Ueda et al. ................. 357/38

FOREIGN PATENT DOCUMENTS 57-59673  12/1982  Japan .

OTHER PUBLICATIONS

"An Optically Coupled High-Voltage PNPN Switch," vol. 48, No. 3, pp. 61–66.

Primary Examiner—Joseph E. Clawson, Jr.
Attorney, Agent, or Firm—Finnegan, Henderson, Farabow, Garrett & Dunner

[57] ABSTRACT

A PNPN switch device with a circuit for preventing an error due to a surge voltage. The circuit comprises two capacitors. The first capacitor is formed in a P-type gate region. The second capacitor of a capacitance of an insulation layer sandwiched between a MOS gate electrode and a capacitor electrode is provided outside the P-type gate region.

7 Claims, 13 Drawing Figures

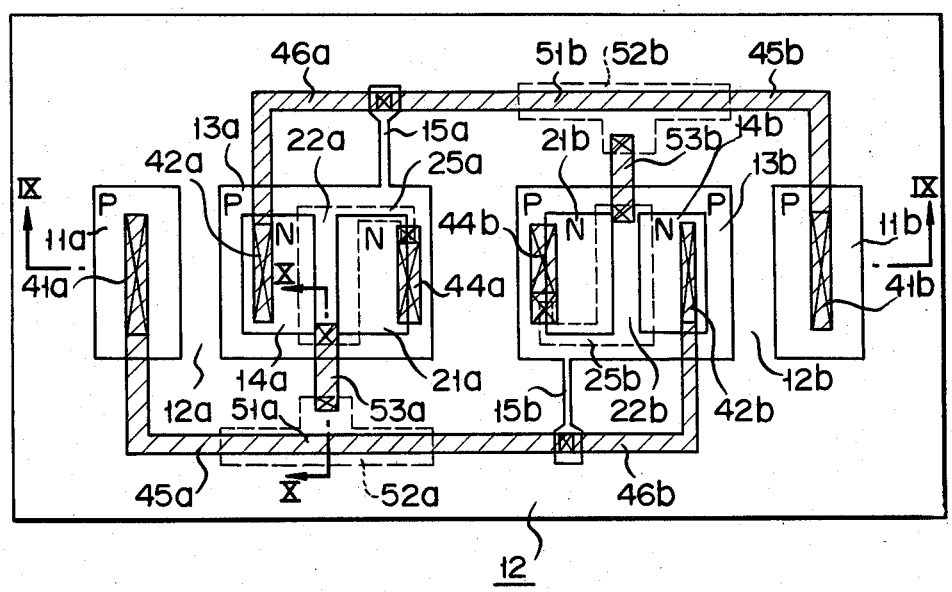
F I G. 4

PNPN SWITCH DEVICE WITH CAPACITOR FORMED OUTSIDE ACTIVE DEVICE AREAS

BACKGROUND OF THE INVENTION

The present invention relates to a light-driven PNPN switch device and, more particularly, to a PNPN semiconductor switch device free of dV/dt malfunction.

When a surge voltage is applied to a light-driven PNPN switch device, a transient current flows within the device. Due to this current, the device erroneously operates since it has no protective circuit. Such an erroneous operation is called "dV/dt malfunction." There is known a light-driven PNPN switch device formed on a semiconductor chip and provided with a protective circuit against dV/dt malfunction, which is formed on the same chip. A PNPN switch of this type is disclosed in Japanese Patent Publication No. Sho 57-59673. An equivalent circuit of this PNPN switch is shown in FIG. 1 attached hereto.

As shown in FIG. 1, the PNPN switch comprises two PNPN switching elements 10a and 10b. It is driven by the light from a light-emitting diode (LED) 20. Element 10a comprises a P-type anode region 11a, an N-type gate region (substrate) 12a, a P-type gate region 13a and an N-type cathode region 14a. Anode region 11a is coupled to a terminal 1, and cathode region 14a is coupled to a terminal 2. Gate region 13a and cathode region 14a are short-circuited by a resistor 15a. Element 10b has the same structure as element 10a. That is, it comprises a P-type anode region 11b, an N-type gate region 12b (or substrate), a P-type gate region 13b and an N-type cathode region 14b. Anode region 11b and cathode region 14b are connected to terminals 2 and 1. Gate region 13b and cathode region 14b are short-circuited by a resistor 15b.

The PNPN switch includes two error-preventing circuits. First error-preventing circuit comprises an N-type impurity region 21a formed within, and hence short-circuited to, P-type gate region 13a, a MOS gate electrode 22a formed between impurity region 21a and N-type cathode region 14a, two capacitors 23a and 24a coupled in series between anode terminal 1 and P-type gate region 13a, and a resistor 25a coupled in parallel to capacitor 24a. The second error-preventing circuit has the same structure as the first. It comprises an N-type impurity region 21a formed within, and hence short-circuited to, P-type gate region 13a, a MOS gate electrode 22a formed between impurity region 21a and N-type cathode region 14a, two capacitors 23a and 24a connected in series between anode terminal 1 and P-type gate region 13a, and a resistor 25a coupled in parallel to capacitor 24a.

When LED 20 emits light to the PNPN switch while a high voltage and a low voltage are applied to terminals 1 and 2, carriers are generated in the PN junction between N-type region 12a and P-type region 13a which are biased in the opposite directions. As a result, a transient current flows through the PN junction between regions 13a and 14a, thereby forwardly biasing this PN junction. Consequently, PNPN switching element 10a is turned on. Suppose a surge voltage is applied between terminals 1 and 2. Without the error-preventing circuits, a transient current would flow through the PN junction between regions 13a and 14a, thus erroneously turning on PNPN switching element 10a. This does not happen since the error-preventing circuits function in the following manner.

When a surge voltage is applied to terminal 1, it is applied to PNPN switching element 10a, generating a transient current in element 10a, and is applied also to the first error-preventing circuit. In the first error-preventing circuit, the voltage is divided by serially coupled capacitors 23a and 24a into a low voltage. This low voltage is applied to MOS gate electrode 22a. Here it should be noted that capacitors 23a and 24a have such capacitances that the MOS capacitor 24a including MOS gate electrode 22a has a threshold voltage higher than the voltage obtained by dividing the surge voltage. Therefore, when a surge voltage rising fast is applied to terminal 1, an N-type inversion layer (i.e., an N-type channel) is formed in the surface of P-type gate region 13a. The inversion layer electrically connects N-type impurity region 21a to N-type cathode region 14a. As a result, the transient current flows from PNPN switching element 10a, more precisely from the PN junction between N-type region 12a and P-type gate region 13a, to N-type cathode region 14a through N-type impurity region 21a held at the same potential as P-type gate region 13a and through N-type inversion layer formed in the surface of P-type gate region 13a. Since the transient current does not flow through the PN junction between regions 13a and 14a, this PN junction is not biased so much as to turn on PNPN switching element 10a. Hence, a dV/dt malfunction is prevented.

When the surge voltage is relatively low or rises slowly, no N-type inversion layer is formed. In this case, the transient current generated within switching element 10a is small, and the PN junction between regions 13a and 14a is not biased so much as to fire switching element 10a. Hence, no dV/dt malfunction will occur.

FIG. 2 is a plan view of the PNPN switch, and FIG. 3 is a sectional view of the switch, taken along line III—III in FIG. 2.

As shown in FIGS. 2 and 3, an N-type silicon substrate 12 is used, the first half of which is the N-type regions 12a of PNPN switching element 10a and the second half of which is the N-type region 12b of NPNP switching element 10b. As stated above, both elements 10a and 10b have the same structure. Therefore, the structure of only element 10a shown on the left of FIGS. 2 and 3 will be described. P-type anode region 11a and P-type gate region 13a are formed in the surface region of P-type silicon substrate 12, set apart from each other. N-type cathode region 14a and N-type impurity region 21a are formed in the surface region of P-type gate region 13a, set apart from each other. As clearly shown in FIG. 2, a strip 15a equivalent to resistor 15a (FIG. 1) extends from P-type gate region 13a. A thin, patterned silicon oxide layer 31 is formed on the entire surface of substrate 12. A polycrystalline silicon MOS gate electrode 22a is formed on that portion of oxide layer 31 which covers N-type anode region 14a, N-type impurity region 21a and the portion of P-type region 13a located between regions 14a and 21a. A strip 25a equivalent to resistor 25a (FIG. 1) extends from gate electrode 22a. An inter-layer insulation layer 32 of CVD-SiO$_2$ is formed on the surface of the entire structure. Layer 32 has contact holes. Aluminum electrodes 41a–4a and aluminum lines 45a and 46a are formed on the layer 32. Electrodes 41a and 42a are an anode electrode and a cathode electrode, and extend through the contact holes and are coupled to P-type anode region 11a and N-type cathode region 14a. Electrode 43a is a capacitor electrode formed on that portion of layer 32 which is above MOS gate electrode 22. Electrode 44a extends through the contact hole and is connected to N-type impurity region 21a and P-type gate region 13a, thus short-circuiting regions 13a and 21a. Electrode 44a is also coupled to strip 25a. Anode electrode 41a and capacitor electrode 43a are connected by aluminum line 45a. Aluminum line 46a is coupled to cathode electrode 42a, extends through a contact hole (not shown) cut in layers 31 and 32 and is connected to P-type strip 15a. Hence, line 46a connects electrode 42a to strip 15a (i.e., a diffusion resistor).

Capacitor electrode 43a, MOS gate electrode 22a and the portion of inter-layer insulation layer 32, which is located between electrodes 43a and 22a, constitute capacitor 23a (FIG. 1). MOS gate electrode 22a, silicon substrate 12 and the portion of oxide layer 31, which is located between electrode 22a and substrate 12, form capacitor 24a (FIG. 1).

The PNPN switch device is advantageous in that it can prevent dV/dt malfunction and that its chip area is much smaller than that of the conventional PNPN switch device. However, its breakdown voltage is inevitably low for the following reason.

As evident from FIG. 2, capacitor 23a (FIG. 1) is formed in P-type gate region 13a. Line 45a connecting capacitor electrode 43a and anode electrode 41a unavoidably extends across the reversely biased PN junction between P-type gate region 13a and N-type substrate 12a. When a high, positive surge voltage is applied between terminals 1 and 2, it is directly applied to line 45. Obviously, the surge voltage narrows the depletion layer in the reversely biased PN junction, causing a surface breakdown. The breakdown voltage of the PNPN switch device is therefore lowered.

Summary of the Invention

Accordingly, the object of the present invention is to provide a PNPN switch device having a high breakdown voltage.

According to the invention, there is provided a PNPN switch device comprising a first N-type region, a first P-type region formed in the surface region of said first N-type region, a second P-type region formed in the surface region of said first N-type region and set apart from said first P-type region, a second N-type region formed in the surface region of said second P-type region to be used as a cathode, a third N-type region formed in the surface region of said second P-type region and set apart from said second N-type region, an insulation layer formed on said second P-type region, a first conductor layer formed on said insulation layer and extending over said second N-type region and said third N-type region, a first electrode short-circuiting said second P-type region and said third N-type region, a second electrode formed on said first P-type region, a third electrode formed on said second N-type region, a resistor formed on said insulation layer and connected at one end to said first conductor layer and at the other end to said first electrode, and a capacitor element formed outside said second P-type region and equivalently connected between said first conductor layer and second electrode.

According to the invention, there is further provided a PNPN switch device comprising a first N-type region, a first P-type region formed in the surface region of said first N-type region, a second P-type region formed in the surface region of said first N-type region and set apart from said first P-type region, a second N-type region formed in the surface region of said second P-type region to be used as a cathode, a third N-type region formed in the surface region of said second P-type region and set apart from said second N-type region, a first insulation layer formed on said second P-type region, a first conductor layer formed on said first insulation layer and extending over said second N-type region and said third N-type region, a first electrode short-circuiting said second P-type region and said third N-type region, a second electrode formed on said first P-type region, a third electrode formed on said second N-type region, a resistor formed on said insulation layer and connected at one end to said first conductor layer and at the other end to said first electrode; and a capacitor element formed outside said second P-type region and equivalently connected between said first conductor layer and first N-type region.

BRIEF DESCRIPITON OF THE DRAWINGS

FIG. 4 is a plan view of a PNPN semiconductor switching device according to the present invention;

DETAILED DESCRIPTION OF THE PREFERRED EMBODIMENTS

Figure 2:
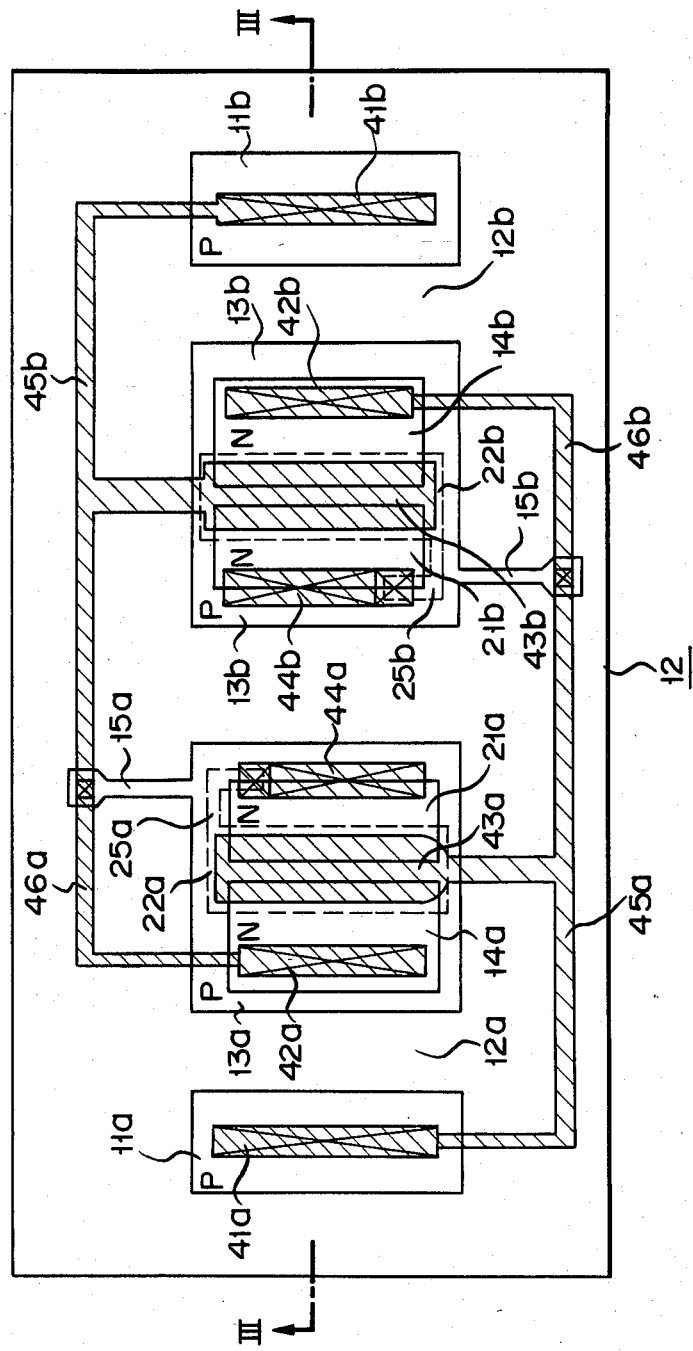
FIG. 2 is a plan view of the conventional switch device shown in FIG. 1.
Figure 3:
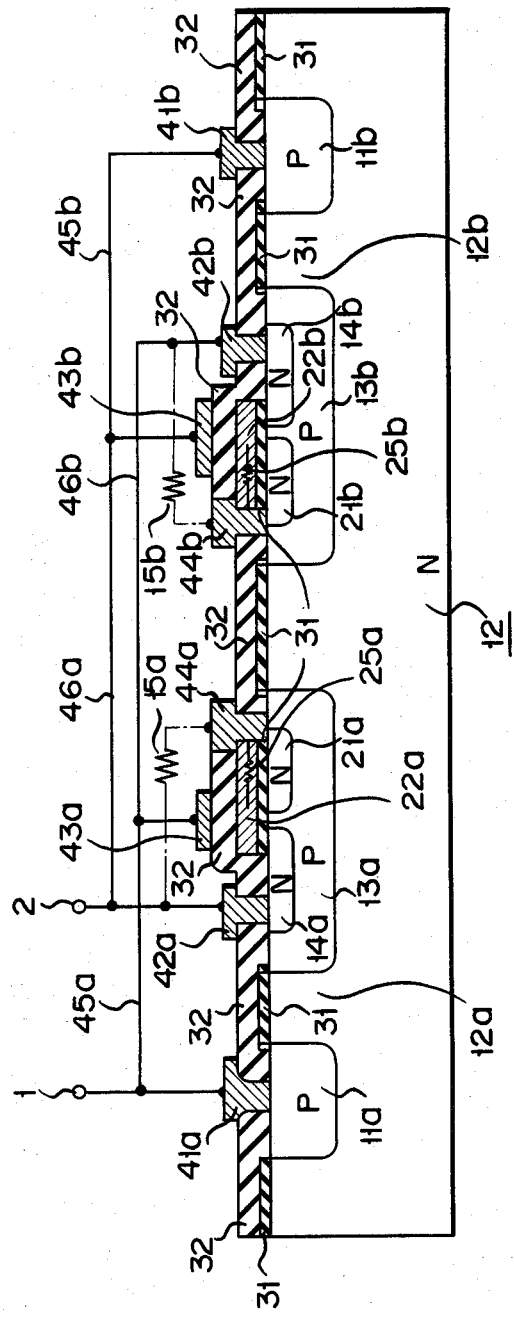
FIG. 3 is a cross-sectional view of the switch device, taken along line III—III in FIG. 1.
Figure 9:
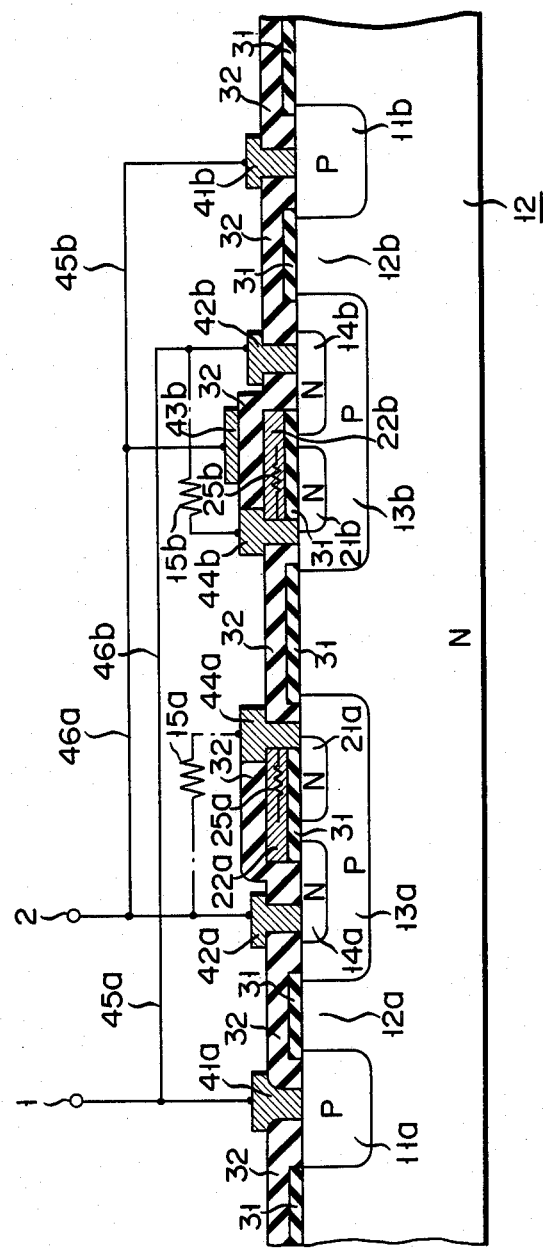
FIG. 9 is a cross sectional view of the switch device, taken along line IX—IX in FIG. 4.
Figure 10:
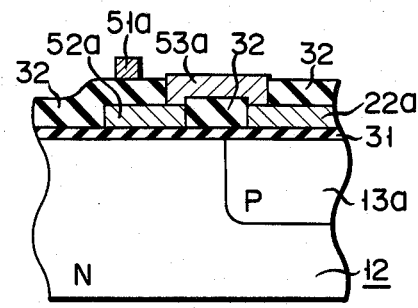
FIG. 10 is a cross sectional view of the switch device, taken along line X—X in FIG. 4.

A PNPN semiconductor switch device according to the invention will now be described with reference to FIGS. 4, 9 and 10. In FIGS. 4, 9 and 10, some of the same elements as those of the known switch device of FIGS. 2 and 3 are not shown and the other same elements are designated by the same numerals.

This PNPN semiconductor switch device comprises an N-type silicon substrate 12, the first half of which is an N-type gate region 12a and the second half of which is an N-type gate region 12b. Two PNPN switching elements 10a and 10b are formed in substrate 12.

Both elements 10a and 10b have the same structure. Only element 10a will be described. A P-type anode region 11a and a P-type gate region 13a are formed in the surface region of substrate 12, set apart from each other. An N-type cathode region 14a and an N-type impurity region 21a are formed in the surface region of P-type gate region 13a, set apart from each other. As clearly shown in FIG. 4, a strip 15a equivalent to resistor 15a (FIG. 1) extends from P-type gate region 13a. A thin, patterned silicon oxide layer 31 is formed on the entire surface of substrate 12. A polycrystalline silicon MOS gate electrode 22a is formed on that portion of oxide layer 31 which covers N-type anode region 14a, N-type impurity region 21a and the portion of P-type region 13a located between regions 14a and 21a. A strip 25a equivalent to resistor 25a (FIG. 1) extends from gate electrode 22a. An inter-layer insulation layer 32 of CVD-SiO$_2$ is formed on the surface of the entire structure. Contact holes are cut in layer 32. Aluminum electrodes 41a–44a and aluminum lines 45a and 46a are formed on the layer 32. Electrodes 41a and 42a are an anode electrode and a cathode electrode, and extend through the contact holes and are coupled to anode region 11a and cathode region 14a. Electrode 44a extends through the contact hole and is connected to N-type impurity region 21a and P-type gate region 13a, thus short-circuiting regions 13a and 21a. Electrode 44a is also coupled to strip 25a. Aluminum line 46a is connected to cathode electrode 42a, extends through a contact hole cut in layers 31 and 32 and is coupled to P-type strip 15a. Hence, line 46a connects electrode 42a to strip 15a (i.e., a diffusion resistor).

Figure 1:
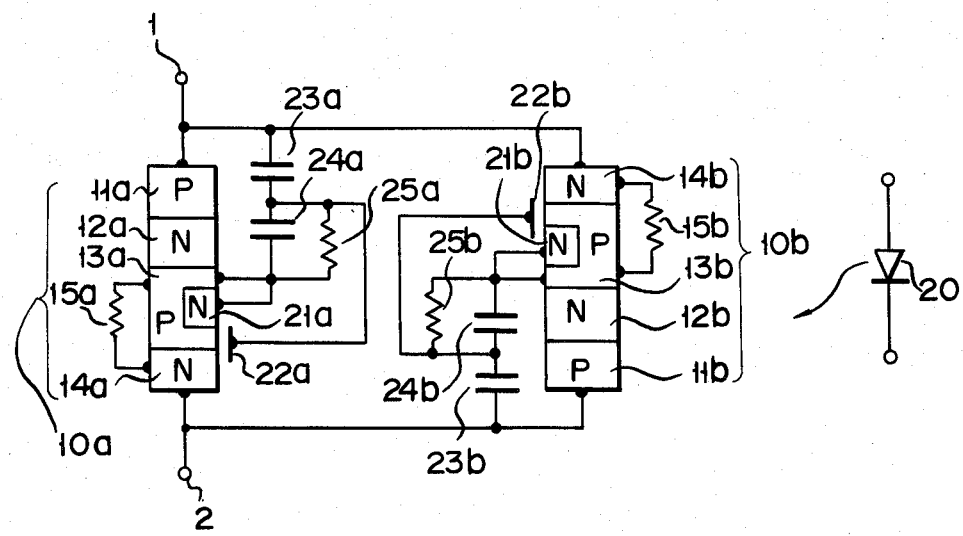
FIG. 1 is an equivalent circuit diagram of a known light-driven PNPN semiconductor switch device.

In this embodiment, capacitor electrode 43a is not formed on MOS gate electrode 22a as in the conventional device. Rather, a portion 51a of a conductor layer 45a forms a capacitor electrode for capacitor 23a. Thus, aluminum line 45a connecting capacitor 23a to anode electrode 41a does not cross the reversely biased PN junction between P-type gate region 13a and N-type gate region 12a. Below capacitor electrode 51a, another capacitor electrode 52a is provided. Electrode 51a is formed on insulation layer 31 by patterning one portion of the polycrystalline silicon layer, the other portion of which is used as MOS gate electrode 22a. An inter-layer insulation layer 32 is interposed between these capacitor electrodes 51a and 52a as shown in FIG. 4. The capacitance of layer 32 is equivalent to capacitor 23a (FIG. 1). An aluminum line 53a, which is a portion of the aluminum layer forming lines 41a–46a, extends across the reversely biased PN junction between P-type gate region 13a and N-type gate region 12a. One end portion of line 53a extends through a contact hole cut in layer 32 and is connected to MOS gate electrode 22a. The other end portion of line 53 extends through a contact hole made in layer 32 and is coupled to capacitor electrode 52a. Hence, line 53a has a potential equal to that of MOS gate electrode 22a.

The equivalent circuit of the device of FIG. 4 is identical with the circuit shown in FIG. 1. Obviously, the PNPN switch device can prevent dV/dt malfunction, like the conventional switch device. As stated above, line 45a directly coupled to anode electrode 41a does not cross the reversely biased PN junction between P-type gate region 13a and N-type gate region 12a, and aluminum line 53a with a potential lower than the anode potential extends across this PN junction. Therefore, the risk of the surface breakdown at the intersection of the line 53a and the PN junction is much reduced as compared with the conventional device. The device of FIG. 4 has a higher breakdown voltage.

In the embodiment, capacitor electrode 52a is made of polycrystalline silicon. Instead, it may be formed of other conductive materials.

Figure 5:
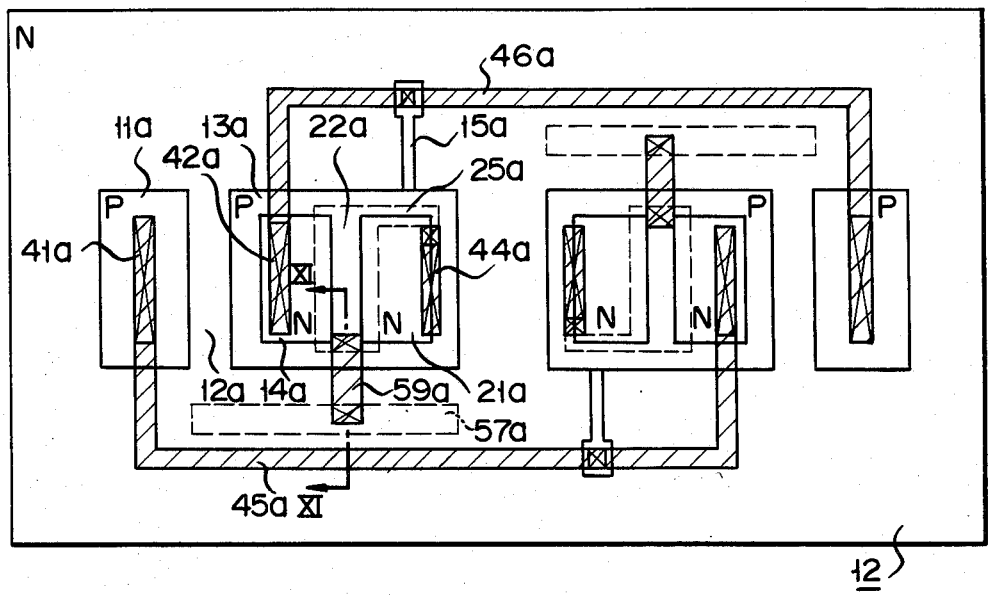
FIG. 5 is a plan view of another PNPN semiconductor switching device according to the invention.
Figure 11:
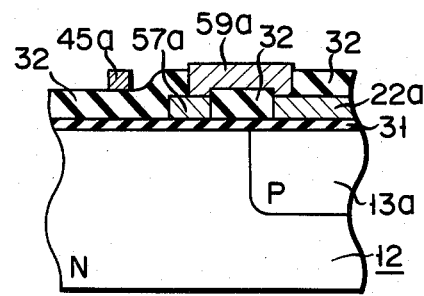
FIG. 11 is a cross sectional view of the switch device, taken along line XI—XI in FIG. 5.

A second embodiment of the invention will now be described with reference to FIGS. 5 and 11. In FIGS. 5 and 11, the same elements as those of the first embodiment of FIGS. 4, 9 and 10 are denoted by the same numerals. In FIG. 5, no numerals are used to denote the elements of the switching element shown on the right. Only the elements different from those of the first embodiment will be explained.

In the second embodiment, a capacitor electrode 57a is formed on that portion of an insulation layer 31 which does not cover a P-type gate region 13a. Capacitor electrode 57a is located closer to a P-type region 13a than a line 45a; it does not overlap line 45a. An insulation layer 32 is formed on electrode 57a. Layer 32 has two contact holes exposing a MOS gate electrode 22a and capacitor electrode 57a. An aluminum line 59a is formed on insulation layer 32. The end portions of line 59a extend through the contact holes, reaching electrodes 22a and 57a. Hence, line 59a connects MOS gate electrode 22a and capacitor electrode 57a. N-type gate region 12a, insulation layer 31 and capacitor electrode 57a constitute a capacitor 23a. Line 45a does not extend across the reversely biased PN junction between P-type gate region 13a and N-type gate region 12a. The risk of the surface breakdown at the intersection of line 53a and the PN junction is more reduced as than by the conventional device.

Figure 6:
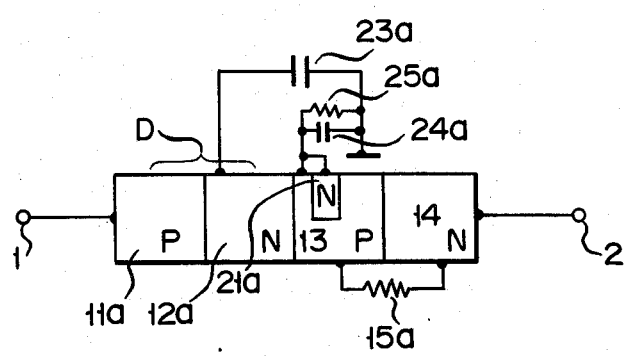
FIG. 6 is an equivalent circuit diagram of the device shown in FIG. 5.

FIG. 6 shows an equivalent circuit of the device shown in FIGS. 5 and 11. As shown in FIG. 6, a device includes a diode D, unlike the conventional PNPN switch device. Diode D is formed by a P-type anode region 11a and N-type gate region 12a. It does not affect the prevention of dV/dt malfunction.

Figure 7:
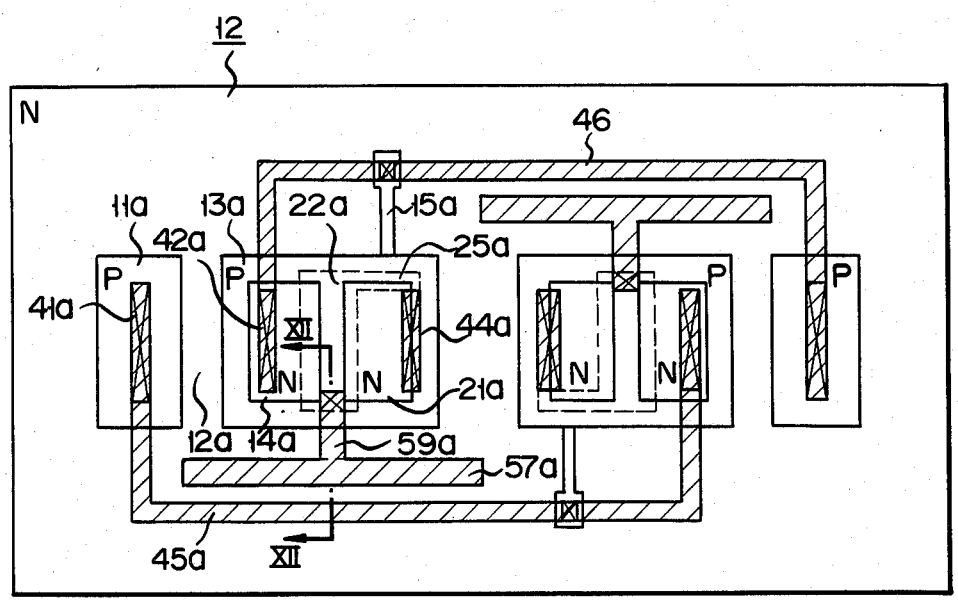
FIGS. 7 and 8 are plan views of two other PNPN semiconductor switch devices according to the invention.
Figure 12:
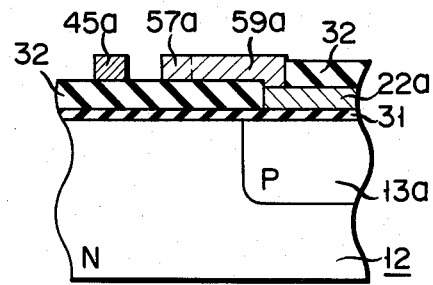
FIG. 12 is a cross sectional view of the switch device, taken along line XII—XII in FIG. 7.

A third embodiment of the invention will now be described with reference to FIGS. 7 and 12. The third embodiment is different from the second embodiment in that a capacitor electrode 57a and a line 59a are formed on an insulation layer 32 and are contiguous. (In the second embodiment, electrode 57a and line 59a sandwich insulation layer 32, and one end portion of line 59a extends through the contact hole cut in layer 32 and is coupled to electrode 57a.) Electrode 57a and line 59a are made of the same material, e.g., aluminum. Electrode 57a, insulation layer 32 and an N-type gate region 12a constitute a capacitor 32a. Also in the third embodiment, a line 45a is not crossing the PN junction between a P-type gate region 13a and N-type gate region 12a. Therefore, the risk of the surface breakdown at the intersection of the line 53a and the PN junction is more reduced than in the conventional PNPN switch device. Moreover, since electrode 57a and line 59a can be formed of the same material and hence in the same step, the structure of the device is simple. The equivalent circuit of the third embodiment is identical with that shown in FIG. 6. The third embodiment can therefore prevent dV/dt malfunction, too.

Figure 8:
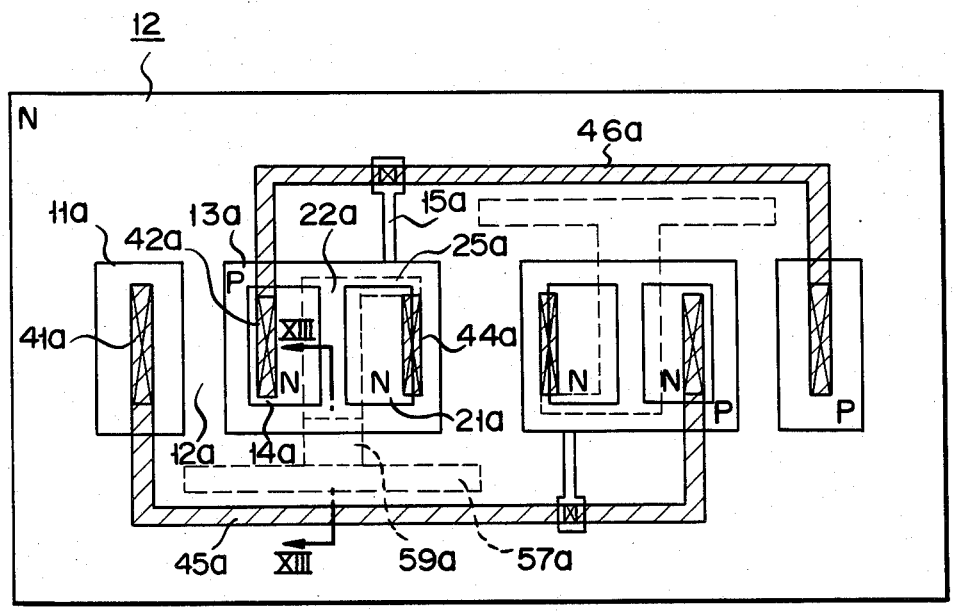
Figure 13:
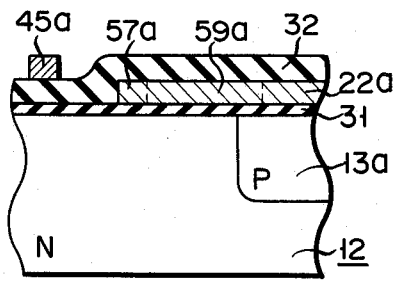
FIG. 13 is a cross sectional view of the switch device, taken along line XIII—XIII in FIG. 8.

A fourth embodiment of the invention will now be described with reference to FIGS. 8 and 13. The fourth embodiment is different from the second and third embodiments in that a MOS gate electrode 22a, capacitor electrode 57a and a line 59a are provided on an insulation layer 31, formed of a single layer. They can be formed in the same step. The fourth embodiment also differs in that an N-type gate region 12a, insulation layer 32 and capacitor electrode 57a constitute a capacitor 23a. In this embodiment, a line 45a does not cross the PN junction between a P-type gate region 13a and N-type gate region 12a, and the risk of the surface breakdown at the intersection of the line 53a and the PN junction is more reduced than in the conventional PNPN switch device. Moreover, since electrodes 22a and 57a and line 59a can be formed of the same material and hence in the same step, the structure of the device is simple. Electrodes 22a and 57a and line 59a can be formed of polycrystalline silicon, aluminum, titanium, tangusten or gold.

As described above, the present invention can provide a PNPN switch device which can prevent dV/dt malfunction and can have a high breakdown voltage.

What is claimed is:

1. A PNPN switch device comprising:
   a first N-type region;
   a first P-type region formed in the surface region of said first N-type region;
   a second P-type region formed in the surface region of said first N-type region and set apart from said first P-type region;
   a second N-type region formed in the surface region of said second P-type region to be used as a cathode;
   a third N-type region formed in the surface region of said second P-type region and set apart from said second N-type region;
   an insulation layer formed on said second P-type region;
   a first conductor layer formed on said insulation layer and extending over said second N-type region and said third N-type region;
   a first electrode short-circuiting said second P-type region and said third N-type region;
   a second electrode formed on said first P-type region;
   a third electrode formed on said second N-type region;
   a resistor formed on said insulation layer and connected at one end to said first conductor layer and at the other end to said first electrode; and
   a capacitor element formed outside said second P-type region and equivalently connected between said first conductor layer and second electrode.

2. A PNPN switch device according to claim 1 wherein said capacitor element comprises a second conductor layer formed on an insulation layer which is formed on the portion of said first N-type region which is outside said second P-type region, a third conductor layer formed on an insulation layer which is formed on said second conductor layer, a first line layer connecting said second electrode and said third conductor layer, and a second line layer connecting said first conductor layer and said second conductor layer.

3. A PNPN switch device comprising:
   a first N-type region;
   a first P-type region formed in the surface region of said first N-type region;
   a second P-type region formed in the surface region of said first N-type region and set apart from said first P-type region;
   a second N-type region formed in the surface region of said second P-type region to be used as a cathode;
   a third N-type region formed in the surface region of said second P-type region and set apart from said second N-type region;
   a first insulation layer formed on said second P-type region;
   a first conductor layer formed on said first insulation layer and extending over said second N-type region and said third N-type region;
   a first electrode short-circuiting said second P-type region and said third N-type region;
   a second electrode formed on said first P-type region;
   a third electrode formed on said second N-type region;
   a resistor formed on said insulation layer and connected at one end to said first conductor layer and at the other end to said first electrode; and
   a capacitor element formed outside said second P-type region and equivalently connected between said first conductor layer and first N-type region.

4. A PNPN switch device according to claim 3 wherein said capacitor element comprises a second conductor layer formed over the portion of said first N-type region which is outside said second P-type region, said second conductor layer having a second insulation layer formed between said second conductor layer and said first N-type region, and said second conductor layer constituting one electrode of a capacitor which comprises said second conductor layer and said second insulation layer as a dielectric, and a line layer connecting said first conductor layer and said second conductor layer.

5. A PNPN switch device according to claim 4 wherein said first and second conductor layers are made of a material different from that of said line layer.

6. A PNPN switch device according to claim 4 wherein said second conductor layer and said line layer are made of a material different from that of said first conductor layer.

7. A PNPN switch device according to claim 4 wherein said first and second conductor layers and said line layer are made of material.

* * * * *

UNITED STATES PATENT AND TRADEMARK OFFICE
CERTIFICATE OF CORRECTION

PATENT NO. : 4,612,562
DATED : September 16, 1986
INVENTOR(S) : Hideaki Motojima et al.

It is certified that error appears in the above-identified patent and that said Letters Patent is hereby corrected as shown below:

On the cover page, please change the city in [73] to
-- Kawasaki-shi --

Signed and Sealed this

Thirty-first Day of March, 1987

Attest:

DONALD J. QUIGG

Attesting Officer

Commissioner of Patents and Trademarks